United States Patent [19]
Lin et al.

[11] Patent Number: 6,037,219
[45] Date of Patent: Mar. 14, 2000

[54] ONE STEP IN SITU DOPED AMORPHOUS SILICON LAYERS USED FOR SELECTIVE HEMISPHERICAL GRAIN SILICON FORMATION FOR CROWN SHAPED CAPACITOR APPLICATIONS

[75] Inventors: Dahcheng Lin, Hsinchu; Jung-Ho Chang, Uen-Lin; Hsi-Chuan Chen, Tainan; Kuo-Shu Tseng, Hsinchu, all of Taiwan

[73] Assignee: Vanguard International Semiconductor Corporation, Hsin-Chu, Taiwan

[21] Appl. No.: 09/105,104

[22] Filed: Jun. 25, 1998

[51] Int. Cl.⁷ .............................................. H01L 21/8242
[52] U.S. Cl. ........................................ 438/255; 438/964
[58] Field of Search ................................ 438/253, 255, 438/396, 398, 665, 964

[56] References Cited

U.S. PATENT DOCUMENTS

| | | | |
|---|---|---|---|
| 5,597,760 | 1/1997 | Hirota | 437/60 |
| 5,618,747 | 4/1997 | Lou | 438/398 |
| 5,634,974 | 6/1997 | Weimer et al. | 117/103 |
| 5,639,685 | 6/1997 | Zahurak et al. | 437/60 |
| 5,656,531 | 8/1997 | Thakur et al. | 438/398 |
| 5,691,249 | 11/1997 | Watanabe et al. | 437/233 |
| 5,726,085 | 3/1998 | Crenshaw et al. | 438/255 |
| 5,851,878 | 12/1998 | Huang | 438/255 |
| 5,858,835 | 1/1999 | Lin | 438/255 |

*Primary Examiner*—Chandra Chaudhari
*Attorney, Agent, or Firm*—George O. Saile; Stephen B. Ackerman

[57] ABSTRACT

A process for creating a crown shaped storage node electrode, covered with an HSG silicon layer, used to increase the surface area, and thus the capacitance of, high density, DRAM designs, has been developed. The process features creating a crown shaped storage node shape, from a composite amorphous silicon layer, wherein the composite amorphous silicon layer is comprised of a heavily doped amorphous silicon layer, used to alleviate capacitance depletion phenomena, sandwiched between undoped, or lightly doped, amorphous silicon layers, used to selectively accept the overlying HSG silicon layer. The process also features the use an HF vapor pre-clean procedure, followed by an in situ, selective deposition of HSG silicon seeds, in a conventional LPCVD chamber, prior to anneal cycle used to form the HSG silicon layer.

27 Claims, 5 Drawing Sheets

ONE STEP IN SITU DOPED AMORPHOUS SILICON LAYERS USED FOR SELECTIVE HEMISPHERICAL GRAIN SILICON FORMATION FOR CROWN SHAPED CAPACITOR APPLICATIONS

Related patent application Ser. No. 09/105/384—"SELECTIVE GROWTH OF A HEMISPHERICAL GRAIN SILICON LAYER ON THE OUTER SIDES OF A CROWN SHAPED DRAM CAPACITOR", by D. C. Lin, J. H. Chang, and H. C. Chen, of Vanguard International Semiconductor Corporation, invention disclosure—VIS87-022, (Filed Jun. 26, 1998), now U.S. Pat. No. 5,913,119 assigned to a common assignee.

BACKGROUND OF THE INVENTION (1) Field of the Invention

The present invention relates to a method used to fabricate a storage node electrode, for a crown shaped, DRAM capacitor structure.

(2) Description of the Prior Art

The major objectives of the semiconductor industry are to continually improve the performance of semiconductor devices, while still maintaining, or decreasing the cost of fabricating these same semiconductor devices. These objectives have been successfully addressed by the ability of the semiconductor industry to produce semiconductor chips with sub-micron features, or micro-miniaturization. Smaller features allow a reduction in performance degrading capacitances and resistances to be realized. In addition smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of a source/drain of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of a billion cells per chip, or greater, has resulted in a specific cell in which a smaller transfer gate transistor is being used, resulting in less of an overlying area for placement of overlying STC structures.

Two methods that have been used to increase STC capacitance, while still decreasing the lateral dimension of the capacitor, have been the use of rough, or hemispherical grain (HSG), silicon layers, and the use of crown shaped STC structures. First, referring to the crown shaped STC structures, the creation of a polysilicon, or amorphous silicon, storage node electrode structure, comprised of both vertical and horizontal silicon features, results in a greater electrode surface area then would have been achieved with counterparts fabricated without vertical features. Secondly the use of an HSG silicon layer, comprised of convex and concave features, and used for the top layer of the storage node electrode structure, again results in a greater degree of surface area then counterparts fabricated with smooth silicon layers. Therefore the combination of a crown shaped STC structure, comprised with a top layer of HSG silicon, residing on the crown shaped storage node structure, is an attractive option for high density DRAM devices.

This invention will describe a novel process for the fabrication of a crown shaped STC structure, featuring an HSG silicon layer, thus offering the attractive combination in regards to increased capacitor surface area. This invention will describe the use of a crown shaped storage node structure, covered by a HSG silicon layer, where crown shaped storage node structure is formed from a composite amorphous silicon layer, comprised of three amorphous silicon layer, all deposited in situ, in a low pressure chemical vapor deposition, (LPCVD), tool, with a heavily doped layer located between two lightly doped amorphous silicon layers. The use of the lightly doped amorphous silicon surfaces allow selective HSG seeding and growth formation, on the exposed, lightly doped surfaces of the crown shaped, storage node structure. In addition the use of the heavily doped amorphous silicon layer supplies the dopants needed to minimize a capacitance depletion phenomena. This invention will also describe a vapor pre-clean procedure, preparing the exposed lightly doped amorphous silicon surfaces, for the in situ deposition of HSG seeds. Prior art such as Thakur et al, in U.S. Pat. No. 5,656,531, or Zahurak et al, in U.S. Pat. No. 5,639,685, describe a processes for fabricating HSG layers, however these prior art do not describe the process offered in this present invention, that is the use of a three layer, amorphous silicon, crown shaped, storage node structure. In addition these references do not describe a hydrofluoric vapor pre-clean procedure, followed by an in situ deposition of HSG seeds, for selective HSG growth in a conventional LPCVD system.

SUMMARY OF THE INVENTION

It is an object of this invention to create a DRAM capacitor structure, in which a capacitance increase is achieved by increasing the surface area of the storage node electrode, via the use of a crown shaped, storage node structure, and via the use of a hemispherical grain, (HSG), silicon layer, residing on the surface of the crown shaped, storage node structure.

It is another object of this invention to form the crown shaped storage node electrode from a composite amorphous silicon layer, comprised of a heavily doped amorphous silicon layer, sandwiched between lightly doped, or undoped amorphous silicon layers.

It is yet another object of this invention to perform an HF vapor pre-clean, and the HSG seeding procedure, in situ, in the same cluster tool, without exposure to air.

It is still another object of this invention to selectively grow the HSG silicon seeds, and to form the HSG silicon layer, only on the undoped, or lightly doped, amorphous silicon surfaces.

In accordance with the present invention a method for fabricating a DRAM device, with increased capacitance realized via the use of crown shaped storage node structure, and the incorporation of an HSG silicon layer on the surfaces of the lightly doped, amorphous silicon, crown shaped storage node structure, has been developed. A transfer gate transistor comprised of: a thin gate insulator; a polysilicon gate structure; a lightly doped source/drain region; insulator spacers on the sidewalls of the polysilicon gate structure; and heavily doped source/drain region; are formed on a semiconductor substrate. A composite insulator layer is deposited on the transfer gate transistor, followed by the creation of a storage node contact hole, in the composite insulator layer, exposing a source region, of a transfer gate transistor. A doped polysilicon plug is formed in the storage node contact hole, contacting the source region of the transfer gate transistor. After deposition of an insulator layer, a hole opening is made in the insulator layer, exposing the top surface of a polysilicon plug, as well as a portion of the top surface of the underlying composite insulator layer. A composite amorphous silicon layer is next deposited, comprised of an underlying undoped, or lightly doped, amorphous silicon layer, a heavily doped amorphous silicon layer, and an overlying undoped, or lightly doped, amorphous silicon layer. A chemical mechanical polishing procedure is used to remove the composite amorphous silicon layer, from the top surface of the insulator layer, exposing the top surface of the insulator layer. Selective removal of the insulator layer, results in a crown shaped storage node shape, comprised of two vertical, composite amorphous silicon layer features, formerly on the sides of the hole opening, connected to a horizontal, composite amorphous silicon layer feature, with the horizontal feature of composite amorphous silicon layer, overlying and contacting the doped polysilicon plug, in the storage node contact hole. The exposed surfaces of the crown shaped, storage node shape, are comprised of undoped, or lightly doped amorphous silicon layer, covering a heavily doped, amorphous silicon layer. A HF vapor pre-clean of the exposed surfaces of the crown shaped, storage node shape, is performed in a first chamber of a cluster tool, followed by the in situ deposition of HSG silicon seeds, formed selectively on the exposed surfaces of the crown shaped, storage node shape, and performed in a second chamber of the cluster tool. An anneal procedure is next used to create a HSG silicon layer, from the HSG silicon seeds, and the underlying, undoped, or lightly doped, amorphous silicon layer, with the HSG silicon layer comprised of convex and concave features. The anneal cycle also results in outdiffusion from the sandwiched, heavily doped, amorphous silicon layer, resulting in a crown shaped storage node electrode, comprised of the HSG silicon layer, overlying doped amorphous silicon, vertical features, and doped amorphous silicon, horizontal features, and contacting the doped polysilicon plug, via the overlying, horizontal amorphous silicon feature. A capacitor dielectric layer is formed on the surface of the crown shaped storage node electrode, followed by the creation of an upper polysilicon electrode, completing the formation of a crown shaped, stacked capacitor structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a crown shaped storage node electrode, used as the bottom electrode of DRAM capacitor structure, featuring an HSG silicon layer selectively formed on the exposed surfaces of the crown shaped storage node shape, will now be described. The transfer gate transistor, used for the DRAM device, of this invention, will be an N channel device. However this invention, using an HSG silicon layer on the exposed surfaces of a crown shaped storage node shape, used to increase the surface area of the DRAM capacitor, can also be applied to P channel, transfer gate transistor. In addition doped, and undoped, polysilicon layers, can be used in place of the doped, and undoped, amorphous silicon layers, for creation of the crown shaped storage node electrode.

Figure 1:
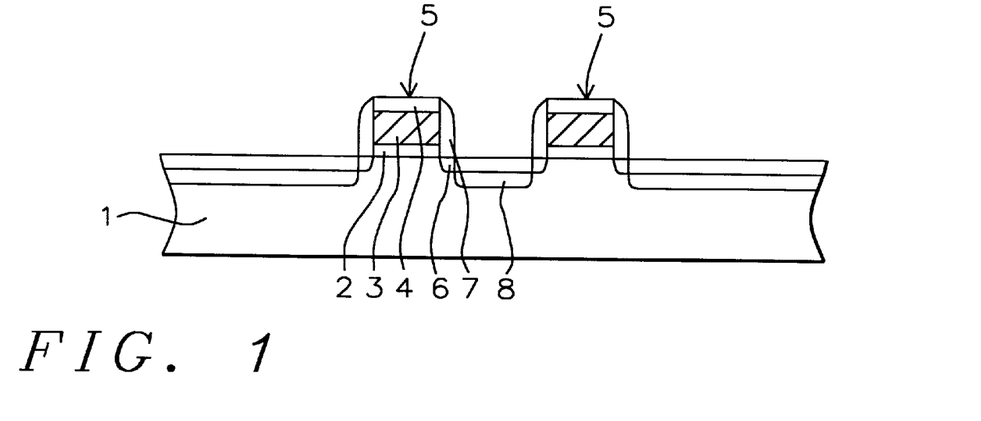
FIGS. 1–10, which schematically, in cross-sectional style, shows the key fabrication stages used in the creation of a crown shaped storage node electrode, used as part of a DRAM, stacked capacitor structure, featuring a HSG silicon layer located on the exposed surfaces of the crown shaped storage node electrode.

Referring to FIG. 1, a P type, semiconductor substrate 1, with a <100>, single crystalline orientation, is used. After a series of wet cleans, a gate insulator layer 2, comprised of silicon dioxide, is thermally grown in an oxygen-steam ambient, at a temperature between about 750 to 1050° C., to a thickness between about 40 to 200 Angstroms. A first polysilicon layer 3, is next deposited using LPCVD procedures, at a temperature between about 500 to 700° C., to a thickness between about 500 to 4000 Angstroms. The polysilicon layer can either be grown intrinsically and doped via ion implantation of arsenic or phosphorous, or polysilicon layer 3, can be in situ doped during deposition via the incorporation of either arsine or phosphine to the silane, or disilane ambient. If lower word line, or gate resistance is desired, polysilicon layer 3, can be replaced by a polycide layer, comprised of a metal silicide layer, such as tungsten silicide or titanium silicide, residing on an underlying doped polysilicon layer. A silicon oxide layer 4, used as a cap insulator layer, is next grown via LPCVD or PECVD procedures, to a thickness between about 600 to 2000 Angstroms. Conventional photolithographic and reactive ion etching, (RIE), procedures, using $CHF_3$ as an etchant for silicon oxide layer 4, and using $Cl_2$ as an etchant for polysilicon or polycide layer 3, are used to create gate structure 5, shown schematically in FIG. 1. Removal of the photoresist layer, used as an etch mask for gate structure definition, is removed using plasma oxygen ashing and careful wet cleans.

A lightly doped source/drain region 6, is next formed via ion implantation of phosphorous, at an energy between about 5 to 60 KeV, at a dose between about 1E13 to 1E15 atoms/cm². Another silicon oxide layer is then deposited, using either LPCVD or PECVD procedures, at a temperature between about 400 to 850° C., to a thickness between about 1500 to 4000 Angstroms, followed by an anisotropic RIE procedure, using $CHF_3$ as an etchant, creating insulator spacers 7, located on the sides of gate structure 5. A heavily doped source/drain region 8, is then formed via ion implantation of arsenic, at an energy between about 30 to 100 KeV, at a dose between about 1E14 to 5E16 atoms/cm². The result of these procedures are again schematically shown in FIG. 1.

Figure 2:
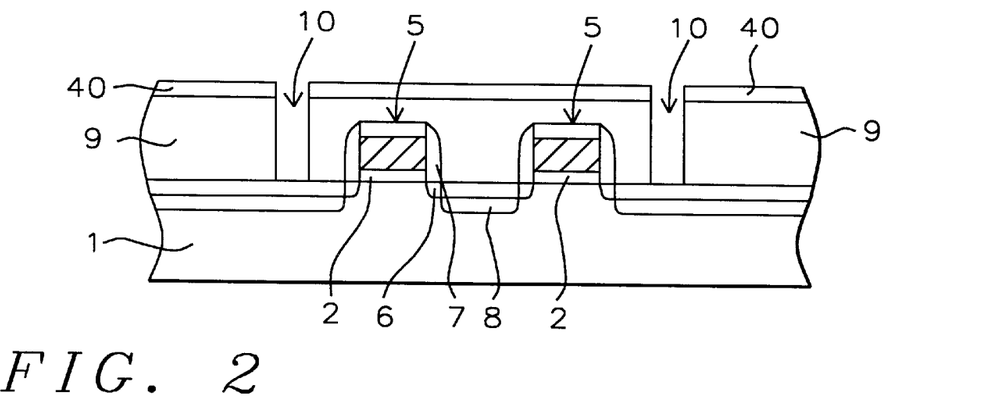

An insulator layer 9, of either silicon oxide, or borophosphosilicate glass, (BPSG), is next deposited via LPCVD or PECVD procedures, to a thickness between about 1000 to 5000 Angstroms. A chemical mechanical polishing, (CMP), procedure is next used to planarize insulator layer 9. If a BPSG layer is used, a reflow procedure, performed at a temperature between about 700 to 1000° C., is employed to create a smoother the top surface topography for the BPSG layer. A silicon nitride layer 40, is next deposited, via LPCVD or PECVD procedures, to a thickness between about 50 to 1000 Angstroms. Conventional photolithographic and RIE procedures, using $CF_4$ as an etchant for silicon nitride layer 40, and using $CHF_3$ as an etchant for silicon oxide layer 9, are used to open storage node contact holes 10, in the composite insulator layer, exposing the top surface of heavily doped source/drain regions 8. This is schematically shown in FIG. 2. Removal of the photoresist shape, used as an etch mask for the creation of storage node contact holes 10, is performed via use of plasma oxygen ashing and careful wet cleans.

Figure 3:
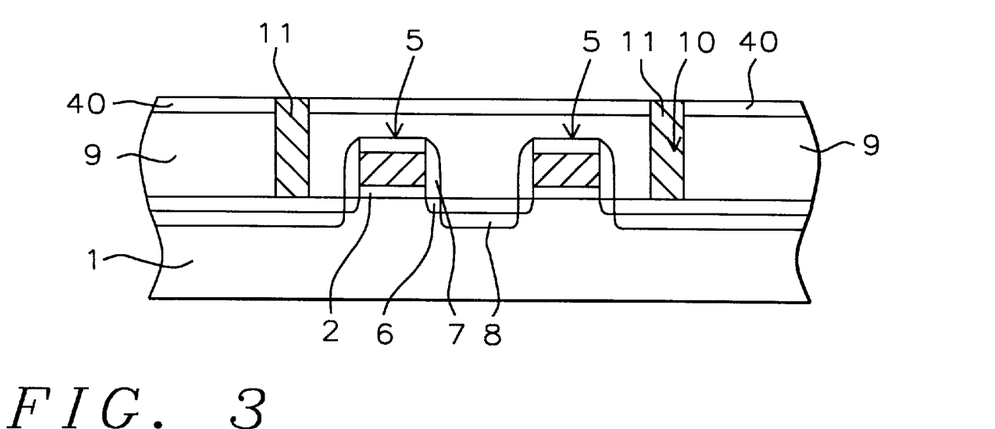

A polysilicon layer is next deposited, using LPCVD procedures, at a thickness between about 1000 to 6000 Angstroms. The polysilicon layer is in situ doped, during deposition, via the addition of arsine, or phosphine, to a silane or disilane ambient, resulting in a bulk concentration for the polysilicon layer, between about 1E19 to 2E20 atoms/cm$^3$. The formation of doped polysilicon plugs 11, in storage node contact holes 10, shown schematically in FIG. 3, is accomplished via removal of unwanted polysilicon, from the top surface of silicon nitride layer 40, using either an anisotropic RIE procedure, using $Cl_2$ as an etchant, or using a CMP procedure.

Figure 4:
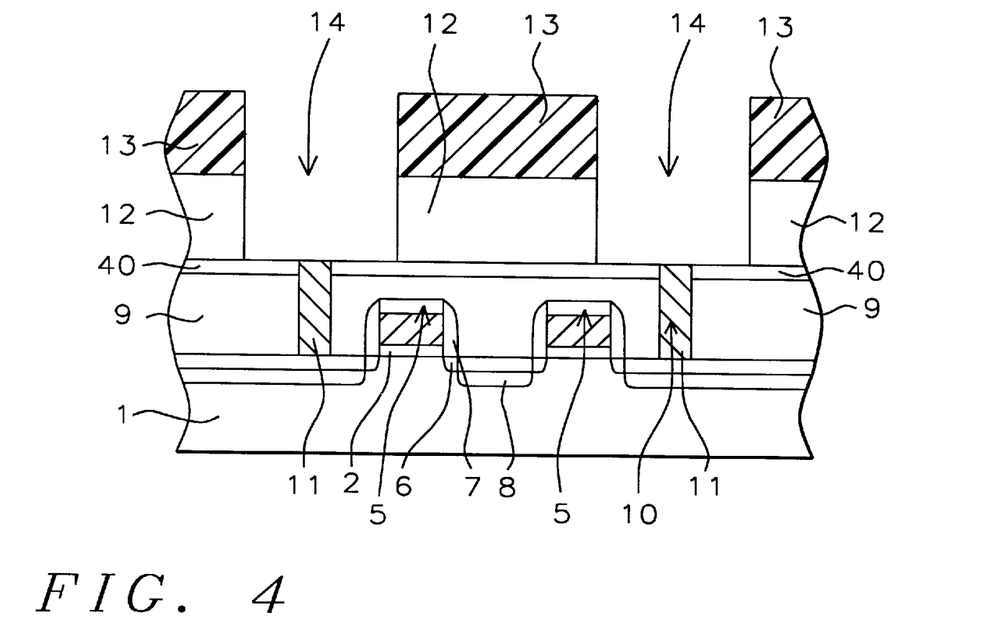

The insulator shapes that will be used to form a subsequent crown shaped storage node electrode are next addressed, and described schematically in FIG. 4. A silicon oxide layer 12, is deposited using LPCVD or PECVD procedures, to a thickness between about 4000 to 20000 Angstroms. A boro-phosphosilicate glass, (BPSG). layer, can also be used, in place of silicon oxide. Photoresist shape 13, is next formed on the top surface of the silicon oxide layer 12, and used as a mask to allow an anisotropic RIE procedure, using $CHF_3$ as an etchant, to create openings 14, in silicon oxide layer 12. Openings 14, expose the top surface of doped polysilicon plugs 11, as well as exposing a portion of the top surface of silicon nitride layer 40. The height, or thickness, of silicon oxide layer 12, will subsequently determine the height of amorphous silicon, vertical features, used as a component of a crown shaped storage node electrode.

Figure 5:
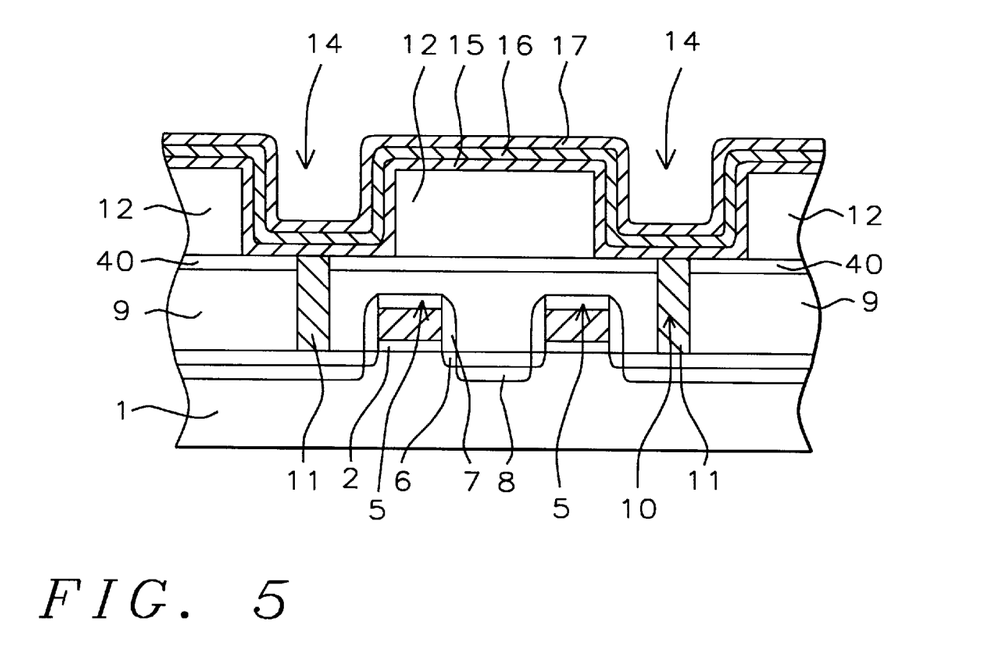

After removal of photoresist shape 13, via plasma oxygen ashing and careful wet cleans, a composite amorphous silicon layer, comprised of lightly doped, and heavily doped layers, is deposited, and shown schematically in FIG. 5. A first, undoped, or lightly doped, amorphous silicon layer 15, is deposited using LPCVD procedures, at a temperature below 550° C., to a thickness less than 400 Angstroms, using silane, or disilane as a source. If the lightly doped, amorphous silicon option is used for layer 15, the doping is accomplished in situ, during the LPCVD procedure, via the addition of phosphine, or arsine, to a silane, or to the disilane source, resulting in a bulk concentration between about 1E19 to 4E20 atoms/cm$^3$. A heavily doped amorphous silicon layer 16, is next deposited in the LPCVD furnace, at a temperature below 550° C., to a thickness less than 1000 Angstroms, and doped in situ, during deposition, via the addition of phosphine, or arsine, to a silane, or to a disilane ambient, resulting in a bulk concentration, for heavily doped amorphous silicon layer 16, greater than 4E20 atoms/cm$^3$. Finally another undoped, or lightly doped amorphous silicon layer 17, is deposited using LPCVD procedures, at a temperature below 550° C., to a thickness less than 400 Angstroms. Again if the lightly doped option, for layer 17, is used, the doping of this layer is accomplished in situ, during deposition, via the addition of arsine or phosphine, to a silane, or to a disilane source, resulting in a bulk concentration between about 1E19 to 4E20 atoms/cm$^3$. The important feature of the composite amorphous silicon layer is that heavily doped amorphous silicon layer 16, needed to avert a capacitance depletion phenomena, that can result with the use of lower doped amorphous silicon layers, is sandwiched between lightly doped amorphous silicon layers. The use of lightly doped amorphous silicon layers, as the surface layers, will allow the formation of an HSG silicon layer, while the same HSG silicon layer, would not have formed on a heavily doped amorphous silicon layer.

Figure 6:
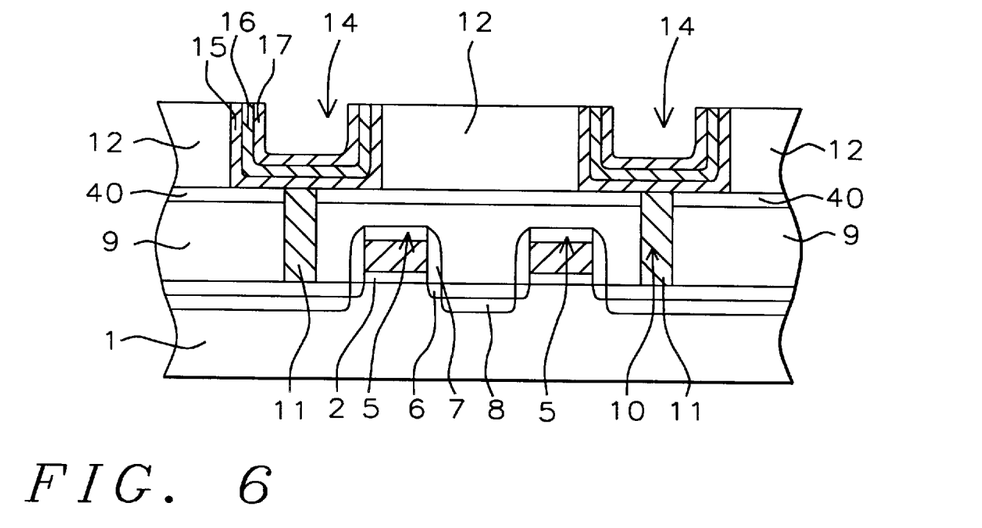
Figure 7:
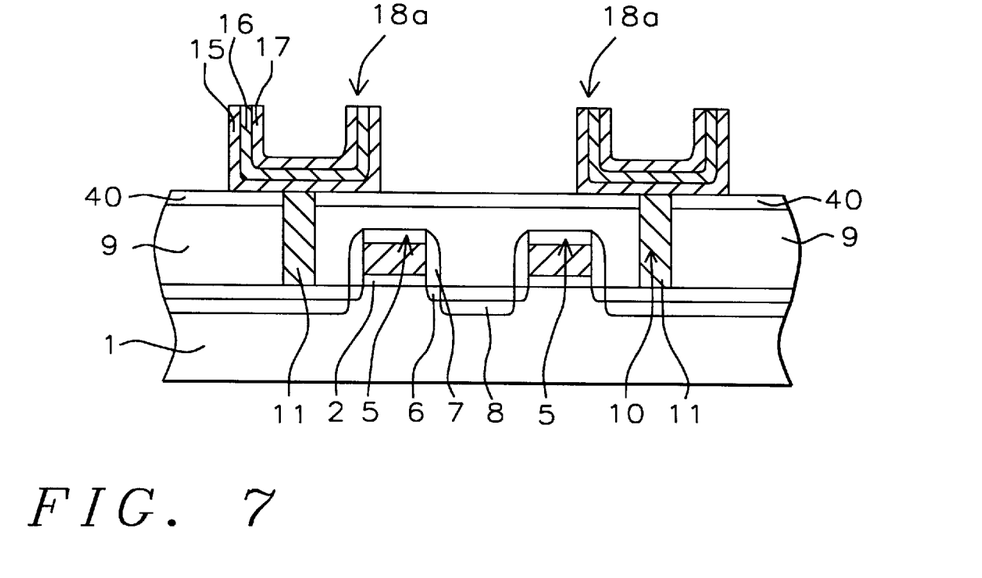

A chemical mechanical polishing, (CMP), procedure is next employed, removing the composite amorphous silicon layer, comprised of underlying, undoped, or lightly doped, amorphous silicon layer 15, heavily doped amorphous silicon layer 16, and overlying, undoped, or lightly doped, amorphous silicon layer 17, from the top surface of silicon oxide layer 12, resulting in the creation of a crown shaped storage node shape, in openings 14. This is schematically shown in FIG. 6. The exposure of the top surface of silicon oxide layer 12, resulting from the CMP procedure, allows a wet etch procedure, using a hydrofluoric, (HF), acid solution, or a HF vapor procedure, to selectively remove silicon oxide, or BPSG layer 12, resulting in crown shape storage node shape 18, comprised two composite, amorphous silicon vertical features, connected by an composite amorphous silicon horizontal feature. The horizontal feature, of crown shaped storage node shape 18a, overlays and contacts, doped polysilicon plug 11, located in storage node contact hole 10. This is schematically shown in FIG. 7. Of importance is that the exposed surfaces of crown shaped storage node shape 18a, are comprised of undoped, or lightly doped, amorphous silicon layer, while the inner layer of crown shaped storage node shape 18a, is heavily doped amorphous silicon layers 16. Again this configuration will be critical when subsequent, selective deposition of HSG silicon seeds, and subsequent formation of an HSG silicon layer, are desired only on the undoped, or lightly doped, amorphous silicon layers 16b. Underlying silicon nitride layer 40, prevented attack of silicon oxide layer 9, during the selective removal of silicon oxide layer 12.

Figure 8:
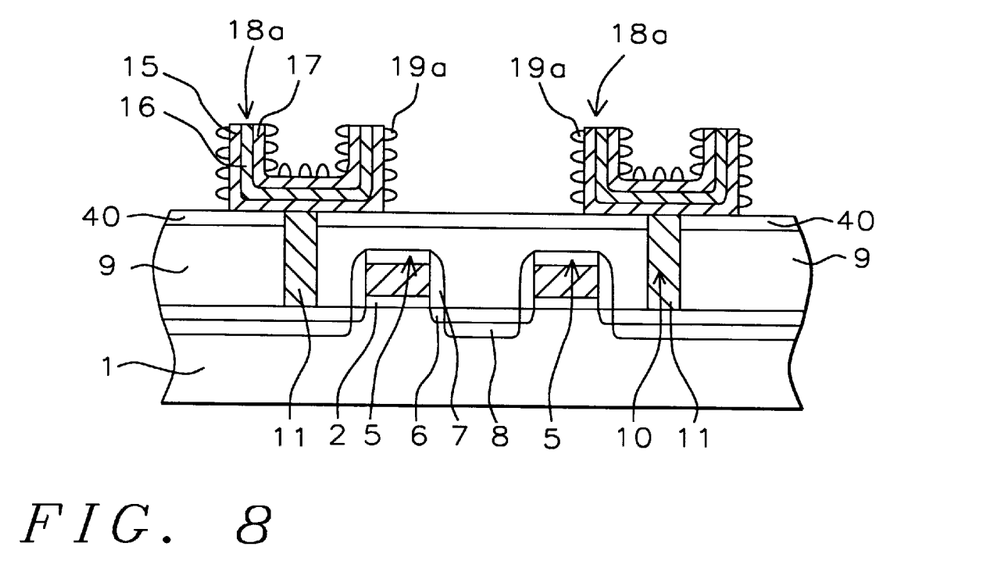
Figure 9:
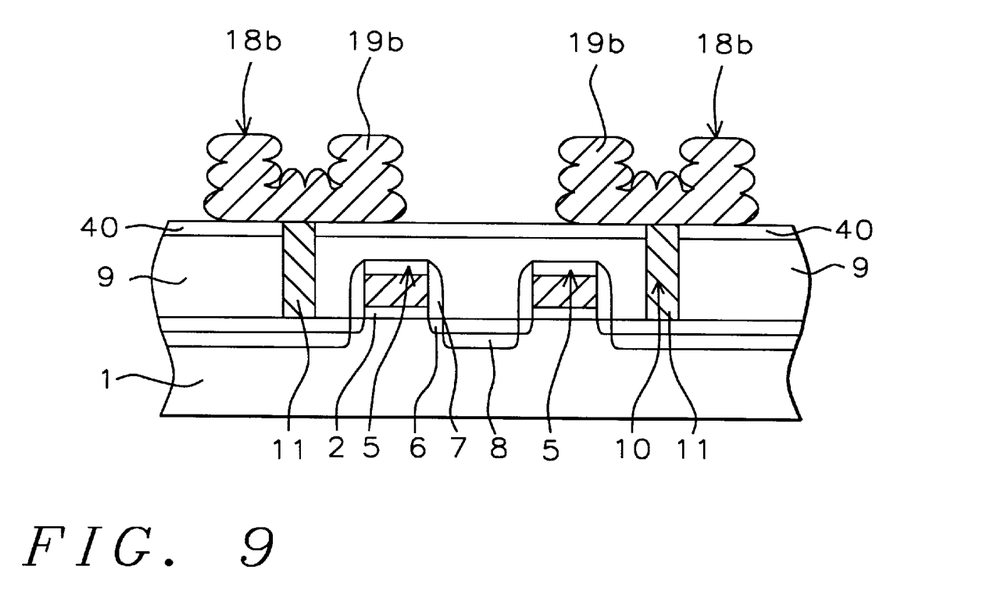

The preparation for, and the formation of, an HSG silicon layer, is next addressed, and described schematically in FIGS. 8–9. A first chamber, of a cluster tool, is used to perform a HF vapor pre-clean procedure, on the exposed surfaces of crown shape storage node shape 18a, at a temperature between about 20 to 30° C., and at a pressure between about 10 to 20 torr. The selective deposition of HSG silicon seeds 19a, is next accomplished, in situ, in a second chamber of the cluster tool, without exposure to air, between the pre-clean and the HSG seeding procedures. HSG silicon seeds 19a, are formed at a temperature between about 550 to 580° C., at a pressure less than 1 torr, using silane as a source, diluted in a nitrogen ambient. An anneal procedure, performed at a temperature between about 550 to 580° C., at a pressure less than 1.0 torr, in a nitrogen ambient, in the second chamber of the cluster tool, is then used to convert HSG silicon seeds 19a, to HSG silicon layer 19b, shown schematically in FIG. 9, forming crown shaped storage node electrode 18b. The convex and concave features of HSG silicon layer 19a, are comprised of HSG silicon with a grain size between about 200 to 800 Angstroms. After removal of the samples from the cluster furnace, a second anneal cycle is performed in another furnace, at a temperature between about 800 to 850° C. This anneal procedure allows outdiffusion from the sandwiched, heavily doped amorphous silicon layer, to the undoped, or lightly doped amorphous silicon layers, thus providing adequate doping throughout the crown shaped storage node electrode 18b, thus preventing a capacitance depletion phenomena that would have occurred if the doping levels, of the undoped, or lightly doped amorphous silicon layers, were not increased after HSG silicon seed deposition.

Figure 10:
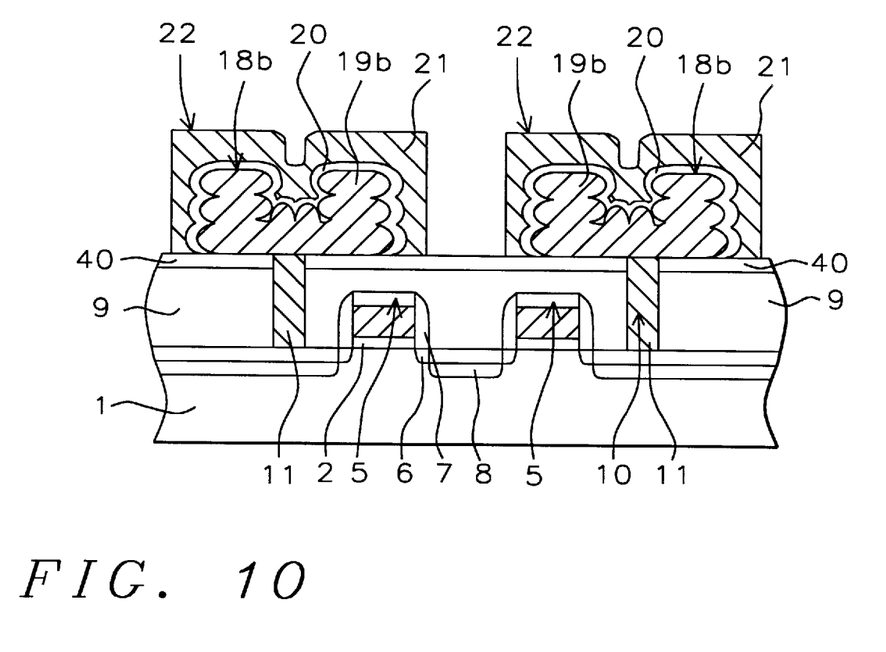

The completion of DRAM capacitor structure 22, featuring crown shaped storage node electrode 19b, comprised with HSG silicon layer 18b, is next addressed, and schematically shown in FIG. 10. A capacitor dielectric layer 20, such as ONO, (Oxidized-silicon Nitride-silicon Oxide), is next formed on crown shaped storage node electrode 19b. The ONO layer is formed by initially growing a silicon dioxide layer, between about 10 to 50 Angstroms, followed by the deposition of a silicon nitride layer, between about 10 to 60 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, to a thickness between about 1000 to 2000 Angstroms. Doping of this polysilicon layer is accomplished using the situ doping, deposition procedure, via the addition of phosphine to a silane ambient. Photolithographic and RIE procedures, using $Cl_2$ as an etchant, are next employed to create polysilicon upper electrode, or plate electrode 21, shown schematically in FIG. 10. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a capacitor structure, for a dynamic random access memory, (DRAM), device, on a semiconductor substrate, comprising the steps of:

providing an underlying transfer gate transistor, comprised of a gate structure, on a gate insulator layer, insulator spacers on the sides of said gate structure, and a source/drain region in an area of said semiconductor substrate, not covered by said gate structure;

forming a storage node contact hole, in a composite insulator layer, exposing the top surface of a source region;

forming a doped polysilicon plug, in said storage node contact hole;

forming an opening in a thick insulator layer, exposing a portion of the top surface of said composite insulator layer, and exposing the top surface of said doped polysilicon plug;

depositing a composite amorphous silicon layer on the top surface of said insulator layer, on the sides of the opening in said insulator layer, on said portion of the top surface of said composite insulator layer, and on top surface of said doped polysilicon plug, exposed in the bottom of said opening in said insulator layer; with said composite amorphous silicon layer comprised of: an underlying, undoped, or lightly doped, amorphous silicon layer; a heavily doped amorphous silicon layer; and an overlying, undoped, or lightly doped, amorphous silicon layer;

removing said composite amorphous silicon layer from the top surface of said insulator layer;

removing said thick insulator layer, resulting in the formation of a crown shaped storage node shape, comprised of vertical shapes of said composite amorphous silicon layer, with said vertical shapes of said composite amorphous silicon layer, connected to a horizontal shape, of said composite amorphous silicon layer, and with said horizontal shape of said composite amorphous silicon layer, overlying and contacting, said doped polysilicon plug, and with both said vertical shapes, and said horizontal shape, of said composite amorphous silicon layers, comprised of said heavily doped amorphous silicon layer, located between said overlying, and said underlying, undoped, or lightly doped, amorphous silicon layers;

performing a pre-clean procedure on exposed surfaces of said undoped, or lightly doped, amorphous silicon layer, of said crown shaped storage node shape, in a first chamber of a cluster tool;

depositing hemispherical grain, (HSG), silicon seeds, on the surfaces of said undoped, or lightly doped, amorphous silicon layer, of said crown shaped storage node shape, in situ, in a second chamber of said cluster tool;

performing a first anneal cycle, in said second chamber of said cluster tool to convert said HSG silicon seeds, to a HSG silicon layer;

performing a second anneal cycle, to distribute dopant from said heavily doped amorphous silicon layer, to said overlying, and to said underlying, undoped, or lightly doped, amorphous silicon layer, and to said HSG silicon layer, creating a crown shaped storage node electrode, comprised of said HSG silicon layer, on a doped, composite amorphous silicon layer;

forming a capacitor dielectric layer on said crown shaped storage node electrode; and forming an upper plate electrode, for said capacitor structure.

2. The method of claim 1, wherein said doped polysilicon plug is formed from a polysilicon layer, obtained using LPCVD procedures, to a thickness between about 1000 to 6000 Angstroms, and in situ doped during deposition, via the addition of phosphine or arsine, to a silane ambient, resulting in a bulk concentration for said doped polysilicon plug between about 1E19 to 2E20 atoms/$cm^3$.

3. The method of claim 1, wherein said thick insulator layer is a silicon oxide layer, obtained via LPCVD or PECVD procedures, to a thickness between about 4000 to 20000 Angstroms.

4. The method of claim 1, wherein said thick insulator layer is a boro-phosphosilicate glass, (BPSG), layer, deposited using LPCVD or PECVD procedures, to a thickness between about 4000 to 20000 Angstroms.

5. The method of claim 1, wherein said opening, in said insulator layer, is formed via an anisotropic RIE procedure, using $CHF_3$ as an etchant.

6. The method of claim 1, wherein said composite amorphous silicon layer is comprised of: underlying, said undoped, or lightly doped, amorphous silicon layer, obtained using LPCVD procedures, to a thickness less than 400 Angstroms, in situ doped, during deposition, via the addition of arsine, or phosphine, to a silane, or disilane ambient, resulting in a bulk concentration between 0 to 4E20 atoms/$cm^3$; said heavily doped amorphous silicon layer, deposited using LPCVD procedures to a thickness less than 1000 Angstroms, in situ doped, during deposition via the addition of arsine or phosphine, to a silane, or disilane ambient, resulting in a bulk concentration greater than 4E20 atoms/$cm^3$; and overlying, said undoped, or lightly doped, amorphous silicon layer, deposited using LPCVD procedures, to a thickness less than 400 Angstroms, and doped in situ during deposition, via the addition of arsine, or phosphine, to a silane, or to a disilane ambient, resulting in a bulk concentration between about 0 to 4E20 atoms/$cm^3$.

7. The method of claim 1, wherein said composite layer of amorphous silicon layers is removed from the top surface of said insulator layer using a chemical mechanical polishing procedure.

8. The method of claim 1, wherein said thick insulator layer is removed using a hydrofluoric, (HF), acid solution, or hydrofluoric gas, with or without water vapor.

9. The method of claim 1, wherein said pre-clean is performed in said first chamber, of said cluster tool, using HF vapors, at a temperature between about 20 to 30° C., at a pressure between about 10 to 20 torr.

10. The method of claim 1, wherein said HSG silicon seeds are formed in situ, in said second chamber of said cluster tool, at a temperature between about 550 to 580° C., at a pressure less then 1 torr, using silane, in a nitrogen ambient.

11. The method of claim 1, wherein said HSG silicon layer is formed from HSG silicon seeds, via said anneal cycle, performed in said second chamber, of said cluster tool, at a temperature between about 550 to 580° C.

12. The method of claim 1, wherein the grain size of said HSG silicon layer is between about 200 to 800 Angstroms.

13. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 60 Angstroms, and thermal oxidation of said silicon nitride layer, creating a silicon oxynitride layer, on the underlying, said silicon oxide layer.

14. A method of fabricating a crown shaped storage node electrode, for a DRAM capacitor structure, on a semiconductor substrate, featuring a pre-clean procedure, followed by an in situ hemispherical grain, (HSG), silicon seed deposition, performed prior to formation of an HSG silicon layer, on lightly doped surfaces, of a crown shaped storage node shape, comprising the steps of:

providing an underlying transfer gate transistor, on said semiconductor substrate, comprised of a polysilicon gate structure, with insulator spacers on the sides of said polysilicon gate structure, overlying a silicon dioxide gate insulator layer, and a source/drain region, in an area of said semiconductor substrate, not covered by said gate structure;

depositing a composite insulator layer, comprised of an underlying silicon oxide layer, and an overlying silicon nitride layer;

forming a storage node contact hole in said composite insulator layer, exposing the top surface of the source region, of said source/drain region;

depositing a doped polysilicon layer, completely filling said storage node contact hole;

removing said doped polysilicon layer, from the top surface of said composite insulator layer, forming a doped polysilicon plug, in said storage node contact hole;

depositing a thick insulator layer;

forming an opening in said thick insulator layer, exposing the top surface of said doped polysilicon plug, and exposing a portion of the top surface of the silicon nitride layer, used as the overlying layer of said composite insulator layer;

depositing a first lightly doped, or undoped amorphous silicon layer, on the top surface of said thick insulator layer, on the sides of said thick insulator layer, exposed in said opening, in said thick insulator layer, and on the top surface of said doped polysilicon plug, and on the portion of the top surface of said composite insulator layer, exposed in the bottom of said opening, in said thick insulator layer;

depositing a heavily doped amorphous silicon layer, on said first, lightly doped amorphous silicon layer;

depositing a second lightly doped, or undoped amorphous silicon layer, on said heavily doped amorphous silicon layer;

removing said second lightly doped amorphous silicon layer, said heavily doped amorphous silicon layer, and said first lightly doped amorphous silicon layer, from the top surface of said thick insulator layer;

removing said thick insulator layer from top surface of said composite insulator layer, resulting in a crown shaped storage node shape, comprised of two, composite amorphous silicon vertical shapes, connected by a composite amorphous silicon horizontal shape, with said composite amorphous silicon horizontal shape overlying and contacting said polysilicon plug structure, and with said composite amorphous silicon vertical shapes, and said composite amorphous silicon horizontal shape, comprised of said heavily doped amorphous silicon layer, sandwiched between said first lightly doped amorphous silicon layer, and said second lightly doped amorphous silicon layer;

performing a HF vapor pre-clean procedure, in a first chamber of a cluster tool;

selectively depositing HSG silicon seeds, in situ, in a second chamber of said cluster tool, on the exposed lightly doped amorphous silicon surfaces of said crown shaped storage node shape;

performing a first anneal cycle, in said second chamber of said cluster tool, to form said HSG silicon layer, from said HSG silicon seeds;

performing a second anneal cycle to distribute dopant from said heavily doped amorphous silicon layer, to said first lightly doped amorphous silicon layer, and to said second amorphous silicon layer, creating said crown shaped storage node electrode, comprised of said HSG silicon layer, on the doped, composite amorphous silicon layer;

forming a capacitor dielectric layer on said crown shaped storage node electrode;

depositing a polysilicon layer; and patterning of said polysilicon layer to form a polysilicon upper electrode, for said DRAM capacitor structure.

15. The method of claim 14, wherein said composite insulator layer is comprised of an underlying layer of either silicon oxide, or boro-phosphosilicate glass, obtained via LPCVD or PECVD procedures, at a thickness between about 1000 to 5000 Angstroms, and is comprised of an overlying layer of silicon nitride, obtained via LPCVD or PECVD procedures, to a thickness between about 50 to 10000 Angstroms.

16. The method of claim 14, wherein said doped polysilicon layer, used for said doped polysilicon plug, is obtained using LPCVD procedures, to a thickness between about 1000 to 6000 Angstroms, and doped in situ, during deposition, via the addition of arsine or phosphine, to a silane ambient, resulting in a bulk concentration between, of said doped polysilicon layer, between about 1E19 to 2E20 atoms/cm$^3$.

17. The method of claim 14, wherein said thick insulator layer is a silicon oxide layer, obtained using LPCVD or PECVD procedures, to a thickness between about 4000 to 20000 Angstroms.

18. The method of claim 14, wherein said thick insulator layer is a boro-phosphosilicate glass, (BPSG), layer, obtained using LPCVD or PECVD procedures, to a thickness between about 4000 to 20000 Angstroms.

19. The method of claim 14, wherein said opening, in said thick insulator layer, is formed from via an anisotropic RIE procedure, using $CHF_3$ as an etchant.

20. The method of claim 14, wherein said first lightly doped, or undoped amorphous silicon layer is deposited using LPCVD procedures, to a thickness less than 400 Angstroms, and doped in situ, during deposition, via the addition of phosphine, or arsine, to a silane, or to a disilane ambient, resulting in a bulk concentration for said lightly doped, or undoped amorphous silicon layer, between about 0 to 4E20 atoms/cm$^3$.

21. The method of claim 14, wherein said heavily doped amorphous silicon layer is obtained using LPCVD procedures, to a thickness less than 1000 Angstroms, and doped in situ, during deposition, via the addition of phosphine, or arsine, to a silane, or to a disilane ambient, resulting in a bulk concentration for said heavily doped amorphous silicon layer, greater than 4E20 atoms/cm$^3$.

22. The method of claim 14, wherein said second lightly doped, or undoped amorphous silicon layer is deposited using LPCVD procedures, to a thickness less than 400 Angstroms, and doped in situ, during deposition, via the addition of phosphine, or arsine, to a silane, or to a disilane ambient, resulting in a bulk concentration between about 0 to 4E20 atoms/cm$^3$.

23. The method of claim 14, wherein the removal of said thick insulator layer is accomplished using a hydrofluoric acid solution, or via use of a hydrofluoric gas, with or without water vapor.

24. The method of claim 14, wherein said HF vapor pre-clean procedure, is performed in said first chamber, of said cluster tool, at a temperature between about 20 to 30° C., at a pressure between about 10 to 20 torr.

25. The method of claim 14, wherein said HSG silicon seeds are formed in situ, in said second chamber of said cluster tool, at a temperature between about 550 to 580° C., at a pressure less than 1.0 torr, using silane, or disilane in a nitrogen ambient, as a source.

26. The method of claim 14, wherein said HSG silicon layer is formed from said HSG silicon seeds, via said first anneal cycle, performed in said second chamber of said cluster tool, at a temperature between about 550 to 580° C., in a nitrogen ambient.

27. The method of claim 14, wherein said HSG silicon layer is comprised with a grain size between about 200 to 800 Angstroms.

* * * * *